United States Patent [19]
Furumochi et al.

[11] Patent Number: 5,986,967
[45] Date of Patent: Nov. 16, 1999

[54] POWER SAVING SYNCHRONIZATION CIRCUIT AND SEMICONDUCTOR STORAGE DEVICE INCLUDING THE SAME

[75] Inventors: Kazuto Furumochi; Tamiji Akita, both of Kawasaki, Japan

[73] Assignee: Fujitsu Limited, Kanagawa, Japan

[21] Appl. No.: 09/050,030

[22] Filed: Mar. 30, 1998

[30] Foreign Application Priority Data

Oct. 20, 1997 [JP] Japan ..................................... 9-287223

[51] Int. Cl.⁶ ...................................................... G11C 8/00
[52] U.S. Cl. ...................................... 365/233; 365/233.5
[58] Field of Search ................................. 365/233, 233.5

[56] References Cited

U.S. PATENT DOCUMENTS

| | | | |
|---|---|---|---|
| 4,744,063 | 5/1988 | Ohtani et al. | 365/233 |
| 4,893,282 | 1/1990 | Wada et al. | 365/233.5 |
| 4,916,668 | 4/1990 | Matsui | 365/233 |
| 4,922,461 | 5/1990 | Hayakawa et al. | 365/233.5 |
| 5,029,135 | 7/1991 | Okubo | 365/233.5 |
| 5,047,984 | 9/1991 | Monden | 365/233 |
| 5,200,926 | 4/1993 | Iwahashi et al. | 365/233.5 |

FOREIGN PATENT DOCUMENTS 61-117784  6/1986  Japan .
62-170095  7/1987  Japan .

*Primary Examiner*—David Nelms
*Assistant Examiner*—Gene N. Auduong
*Attorney, Agent, or Firm*—Nikaido Marmelstein Murray & Oram LLP

[57] ABSTRACT

According to the present invention, a synchronization circuit, which receives a plurality of input signals and a sync signal and performs a predetermined operation corresponding to said input signals in synchronization with said sync signal, comprising: a transition detector for detecting each transition of said plurality of input signals and for generating transition detection signal indicating that said transition occurs; and an internal sync signal generator for, upon the receipt of said sync signal, supplying an internal sync signal to said synchronization circuit when said detection signal indicate that said transition occurs, and for ceasing to supply said internal sync signal to said synchronization circuit, regardless of whether said sync signal is received, when said transition detection signal does not indicate that said transition occurs. According to the present invention, power consumption accompanying an unwanted, repeated operation can be eliminated.

12 Claims, 14 Drawing Sheets

SEMICONDUCTOR STORAGE DEVICE OF EMBODIMENT

SEMICONDUCTOR STORAGE DEVICE OF EMBODIMENT

CIRCUIT OF SEMICONDUCTOR STORAGE DEVICE

SENSE AMPLIFIER

READ OPERATION

SENSE AMPLIFIER

READ OPERATION

WRITE AMPLIFIER

WRITE OPERATION

TRANSITION DETECTOR

SECOND EMBODIMENT

POWER SAVING SYNCHRONIZATION CIRCUIT AND SEMICONDUCTOR STORAGE DEVICE INCLUDING THE SAME

BACKGROUND OF THE INVENTION

1. Field of the Invention

The present invention relates to a synchronization circuit for performing a predetermined operation in response to a received sync signal, in particular, to a synchronization circuit to which an internal sync signal is not transmitted when transition of a plurality of received signals does not occur, and to a storage device having such a synchronization circuit.

2. Related Arts

A synchronization semiconductor storage device, which can be operated at high speed, includes an input circuit for latching an address signal and other control signals in response to a sync signal, such as a clock, received from the outside; a sense amplifier for detecting data in a memory cell; and a write amplifier for writing data to a memory cell.

Even when, for example, an address signal is skewed, by employing the above sync signal the entry of data is possible after the address signal has been established. Therefore, waste operation in an input circuit can be eliminated and the period of time that is required to establish an address signal can be shortened. Or, a system can rapidly fetch the data by operating a sense amplifier in response to a sync signal. In addition, the period of time that is required to establish a write data signal can be shortened by initiating the operation of a write amplifier in response to a sync signal. Therefore, processing for which a sync signal is used is indispensable when the speed of memory is to be increased.

The same procedures can be employed for a synchronization circuit, not limiting to the memory, which performs processing in accordance with a plurality of signals, which are supplied in response to a supplied sync signal.

However, even when there are no changes in input signals to which normally the circuit responds, the synchronized memory or the synchronization circuit continues to perform a predetermined operation in response to received sync signals, so that power is consumed wastefully.

In a case where there is no change in an address signal and a reading condition, even though the data have not been changed, a sense amplifier in a synchronized memory will detect data to read in the memory in response to a sync signal. Such operation when performed by the sense amplifier is mere repetition, which constitutes a waste of power.

In a case where there is no change in an address signal and in the data to be written, and when the writing condition is the same, even though the writing of the data to a target memory has been completed, a write amplifier in a synchronized memory performs a writing operation in response to a sync signal. The write amplifier merely repeats an operation that has been completed, which results in a waste of power.

SUMMARY OF THE INVENTION

It is, therefore, one object of the present invention to provide a synchronization circuit that can eliminate the wasteful consumption of power by the circuit when it is operated in response to a sync signal.

It is another object of the present invention to provide a semiconductor storage device that eliminates power consumption waste by a sense amplifier which is operated in response to a sync signal.

It is an additional object of the present invention to provide a semiconductor storage device that eliminates power consumption waste by a write amplifier which is operated in response to a sync signal.

To achieve the above objects, according to a first aspect of the present invention, a synchronization circuit, which receives a plurality of input signals and a sync signal and performs a predetermined operation corresponding to said input signals in synchronization with said sync signal, comprising:

a transition detector for detecting each transition of said plurality of input signals and for generating transition detection signal indicating that said transition occurs; and an internal sync signal generator for, upon the receipt of said sync signal, supplying an internal sync signal to said synchronization circuit when said detection signal indicate that said transition occurs, and for ceasing to supply said internal sync signal to said synchronization circuit, regardless of whether said sync signal is received, when said transition detection signal does not indicate that said transition occurs.

According to the present invention, power consumption accompanying an unwanted, repeated operation can be eliminated.

In addition, to achieve the above objects, according to a second aspect of the present invention, a semiconductor storage device, which has a plurality of memory cells and which at least receives a plurality of address signals, a read control signal, and a sync signal, comprising:

a sense amplifier for detecting data in said memory cell;

a transition detector for detecting each transitions of said plurality of address signals and said read control signal, and for generating a transition detection signal indicating that one of said transitions occurs; and an internal sync signal generator for, upon the receipt of said sync signal, supplying a read sync signal to said sense amplifier when said transition detection signal indicates said occurrence of said transition, and for ceasing to supply said read sync signal to said sense amplifier, regardless of whether said sync signal is received, when said transition detection signal does not indicate said transition occurs, wherein said sense amplifier is operated upon the receipt of said read sync signal.

According to the present invention, the operation of the sense amplifier accompanying an unnecessary reading operation can be eliminated, and power consumption can be reduced.

Further, to achieve the above objects, according to a third aspect of the present invention, a semiconductor storage device, which has a plurality of memory cells and which at least receives a plurality of address signals, a read control signal, a write data signal and a sync signal, comprising:

a write amplifier for, upon the receipt of said data write signal, driving a bus line pair connected to said memory cell;

a transition detector for detecting each transition of said plurality of address signals, said write data signal and said read control signal and for generating a transition detection signal indicating that one of said transitions occurs; and an internal sync signal generator for, upon the receipt of said external sync signal, supplying an internal sync signal to said write amplifier when said transition detection signal indicates that said transition occurs, and for ceasing to supply said internal sync signal to said write amplifier, regardless of whether said sync signal is received, when said transition detection signal does not indicate that said transition occurs, wherein said write amplifier drives said bus line pair when said internal sync signal is received, and does not drive said bus line pair when said internal sync signal is not received.

According to the present invention, the operation of the write amplifier accompanying an unnecessary reading operation can be eliminated, and power consumption can be reduced.

DETAILED DESCRIPTION OF THE PREFERRED EMBODIMENTS

The preferred embodiments of the present invention will now be described while referring to the accompanying drawings. The technical scope of the present invention, however, is not limited to these embodiments.

Figure 1:
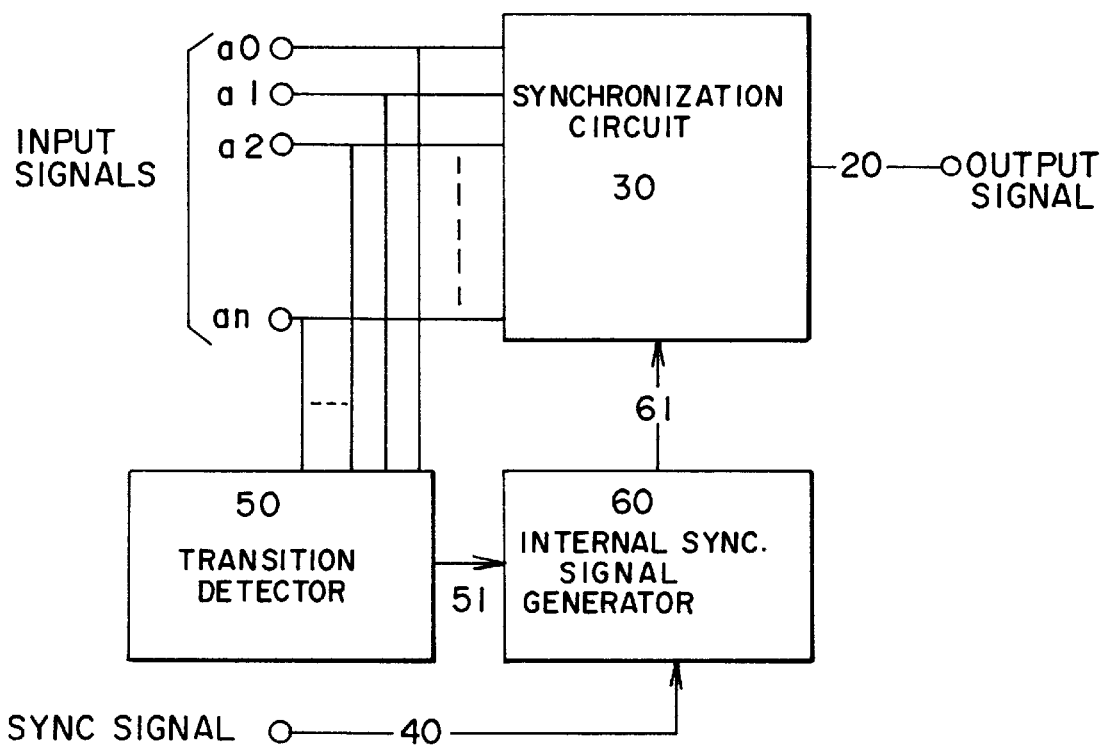
FIG. 1 is a diagram for explaining the principle of the present invention.

FIG. 1 is a diagram for explaining the principle of the present invention. In this example, a synchronization circuit 30 receives a plurality of input signals a0 to an, and performs a predetermined operation in synchronization with an internal sync signal 61. The internal sync signal 61 is generated by an internal sync signal generator 60 upon the receipt of an externally supplied sync signal 40. A transition detector 50 detects the transitioning of a plurality of input signals a0 to an, and transmits a transition detection signal 51 to the internal sync signal generator 60 when a transition occurs in one of the input signals. When the transition detection signal 51 indicates, as described above, that a transition has occurred, following the receipt of the sync signal 40, the internal sync signal generator 60 generates the internal sync signal 61 at a predetermined timing. Furthermore, when the transition detection signal 51 does not indicate that a transition has occurred, the internal sync signal generator 60 does not generate the internal sync signal 61, regardless of whether the sync signal 40 is received.

Therefore, the synchronization circuit 30 does not merely perform a predetermined operation in response to the sync signal 40, but performs an operation in response to the generation of the internal sync signal 61 when a transition occurs in any of the supplied input signals a0 to an, and an operation differing from the previous one is required. When there is no change in the input signals a0 to an, the synchronization circuit 30 does not receive the internal sync signal 61 and does not wastefully perform the predetermined operation.

The circuit shown in FIG. 1 is effective when the operation of the synchronization circuit 30 requires the consumption of a large amount of power. When the consumption of operating power by the synchronization circuit 30 is much larger than the power consumption that accompanies the operation of the transition detector 50, though the provision of the transition detector 50 for detecting transitions of the input signals, and the internal sync signal generator 60, a savings in power consumption, compared with that of the prior art, can be achieved.

Figure 2:
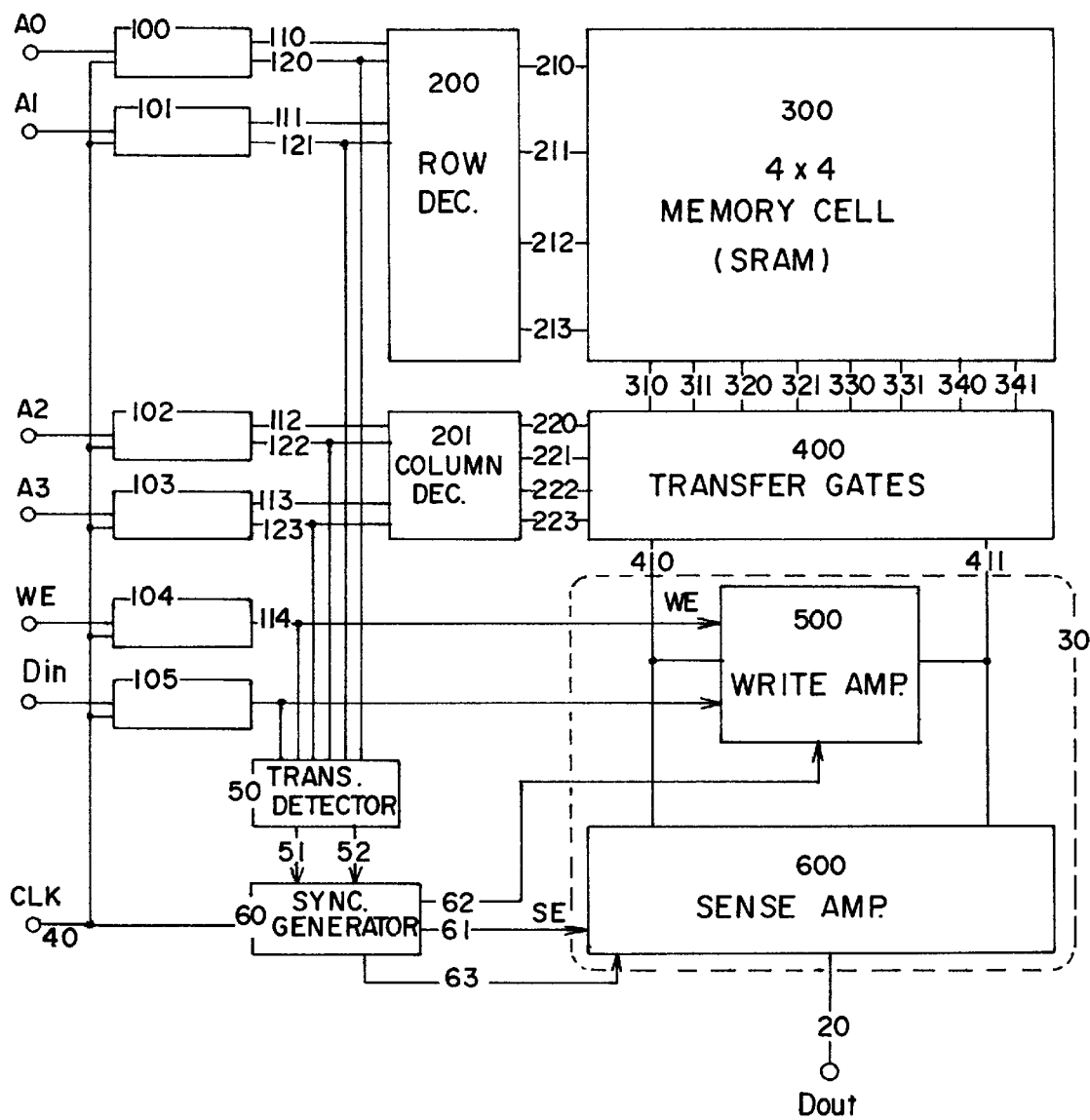
FIG. 2 is a diagram illustrating the overall arrangement of a semiconductor storage device according to a first embodiment of the present invention.

FIG. 2 is a diagram illustrating the overall arrangement of a semiconductor storage device according to one embodiment of the present invention. In this example is shown a static RAM having a memory cell region 300 consisting of 4 columns and 4 rows. A clock sync signal 40 from an external system is supplied to the SRAM, and in accordance with the sync signal 40 address signals $A_0$ to $A_3$ are latched in input registers 100 to 103. Also, in accordance with the sync signal 40, a write enable signal WE, which is a write/read control signal, and write data $D_{in}$ are latched in input registers 104 and 105.

In addition, upon the receipt from the external system of the sync signal 40, the internal sync signal generator 60 generates internal sync signals 61 to 63 at predetermined timings, transmitting the signal 62 to a write amplifier 500 and the signals 61 and 63 to a sense amplifier 600. The write amplifier 500 and the sense amplifier 600 perform their operations upon the receipt of the internal sync signals 61 to 63.

As is described above, in the synchronization SRAM shown in FIG. 2, input signals are fetched in response to the externally supplied sync signal 40, and the operation timings for the write amplifier 500 and the sense amplifier 600 are controlled by the internal sync signals 61 to 63, which are generated upon the receipt of the sync signal 40. As a result, high speed processing can be performed.

In the example in FIG. 2, two-bit address signals $A_0$ and $A_1$ are supplied as inverted and non-inverted signals, 110 and 120, and 111 and 121, to a row decoder 200, which in turn decodes these signals. Then, one of four word lines 210 to 213 is selected and driven. Similarly, two-bit address signals $A_2$ and $A_3$ are supplied as inverted and non-inverted signals, 112 and 122, and 113 and 123, to a column decoder 201, which in turn decodes these signals. Then, one pair of four-bit line pairs, 310 and 311 through 340 and 341, is selected, and a corresponding column transfer gate 400 is rendered conductive and is connected to paired data bus lines 410 and 411.

The read sense amplifier 600 is activated by the sense enable internal sync signal 61, and resetting, such as the equalization of the paired data bus lines 410 and 411, is performed by an internal reset sync signal 63. A write enable signal 114 latched in the input register 104, write data 115 latched in the input register 105 and a sync signal 62 for activation are supplied to the write sense amplifier 500.

In FIG. 2, the write amplifier 500 and the sense amplifier 600 correspond to the synchronization circuit 30 explained while referring to FIG. 1 and which illustrates the principle of the present invention. The transition detector 50 detects whether the supplied address signals, the write enable signal WE and the write data signal have been transitted. For this purpose, signals output by the input registers 100 to 105, in which the input signals are held, are supplied to the transition detector 50.

The transition detector 50 detects that the address signal or the write enable signal WE has been transmitted, and sets the read transition detection signal 51 to the first level. It should be noted that when the write enable signal WE is in the writing condition (level L) the read transition detection signal 51 does not go to the first level. In addition, the transition detector 50 detects the condition when all the address signals and the write enable signal WE are not transitted, and sets the transition detection signal 51 to the second level. In response to the read transition detection signal 51 at the first level, the internal sync generator 60 supplies the internal sense enable sync signal 61 and the internal reset sync signal 63 to the sense amplifier 600. Also, in response to the read transition detection signal 51 at the second level, the internal sync generator 60 does not generate the internal sense enable sync signal 61 and the internal reset sync signal 63, regardless of whether the external received sync signal 40 is received.

Furthermore, the transition detector 50 detects that the address signal, the write enable signal WE or the write data signal has been transitted, and sets the write transition detection signal 52 to the first level. When the transition detector 50 detects that the address signals, the write enable signal WE and the write data signal has not been transitted, it sets the write transition detection signal 52 to the second level. In response to the setting of the write transition detection signal 52 at the first level, the internal sync generator 60 supplies the activation sync signal 62 to the write amplifier 500. Also, in response to the setting of the write transition detection signal 52 at the second level, the internal sync generator 60 does not generate the activation sync signal 62, regardless of whether the external sync signal 40 is received.

Figure 3:
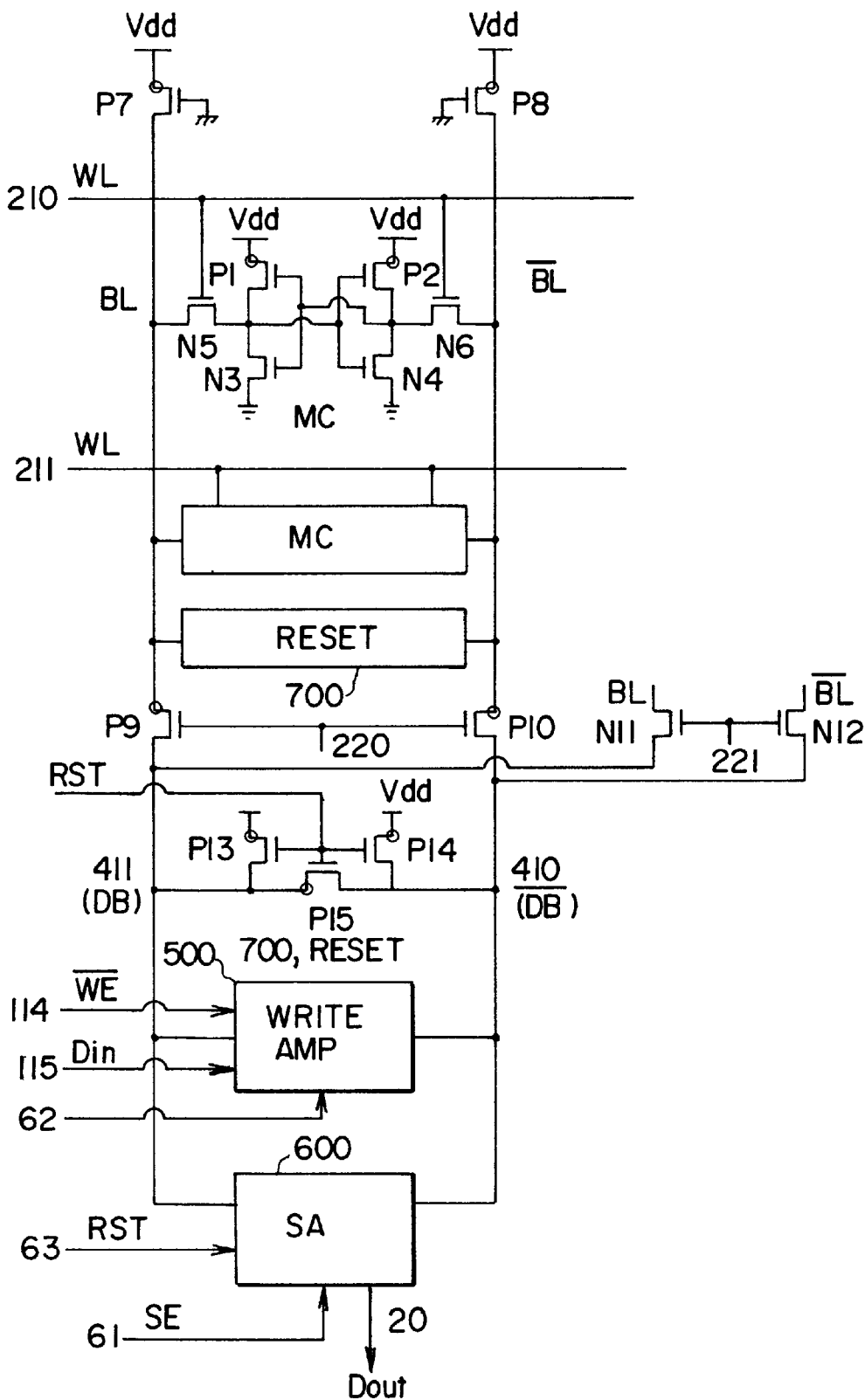
FIG. 3 is a detailed circuit diagram illustrating the semiconductor storage device.

FIG. 3 is a detailed circuit diagram illustrating the semiconductor storage device. In FIG. 3 are shown paired bit lines BL and /BL for one column and paired data bus lines DB and /DB, which are connected to the bit line pair BL, /BL, and a memory cell MC is located at the intersection of a word line 210 and the paired bit lines BL and /BL. The memory cell MC is a SRAM cell consisting of a CMOS circuit, which includes a latch circuit constituted by P type transistors P1 and P2 and N type transistors N3 and N4, and selection transistors N5 and N6, which are located between the bit lines BL and /BL. The gate electrodes of the selection transistors N5 and N6 are connected to the word line 210.

P type transistors P7 and P8 are arranged as load transistors to the bit lines BL and /BL, and are connected to a power source $V_{dd}$. The paired bit lines BL and /BL are connected to the data bus lines DB and /DB via transistors P9 and P10, which are column transfer gates. A reset circuit 700, the write amplifier 500 and the sense amplifier 600 are connected to the paired data bus lines DB and /DB. The reset circuit 700 includes P type transistors P13, P14 and P15 and receives a reset control signal RST. In response to the rising pulse of the reset control signal RST, the transistors P13 to P15 are rendered conductive, and equalize the potential on the paired data bus lines DB and /DB and precharge them to the power voltage level $V_{dd}$. This resetting operation is performed before the writing and reading operations.

In the reading operation for the semiconductor storage device in FIG. 3, the word line 210 is driven up to level H in a condition where the bit line pair and the data bus line pair are initially reset to the power voltage level $V_{dd}$ by the reset circuit 700. As a result, the latch circuit in the memory cell MC is connected to the paired bit lines BL and /BL. Assuming that the transistors P2 and N3 are currently conductive, the bit line BL is driven by the transistor N3 and the level of the bit line BL is lowered. Meanwhile, the bit line /BL is maintained at the reset level.

Then, the gates P9 and P10 are rendered conductive by the column selection signal 220, and the difference in their levels is transmitted to the paired data bus lines DB and /DB. The sense amplifier 600 is activated in response to the sense enable signal SE (61), which is generated at a predetermined timing in response to the externally supplied sync signal 40, and the difference in the voltages of the paired data bus lines DB and /DB is detected and amplified, and the data that are read are output to an output terminal 20 (Dout). In addition, in response to the reset control signal RST, the voltage of the paired data bus lines DB and /DB are equalized, and a data bus line that is at level L is driven up to the power voltage level through the transistors P13, P14, P15.

In the writing operation in the semiconductor storage device shown in FIG. 3, the data bus lines DB and /DB are first set at the power voltage reset level. But when the write amplifier 500 receives the activation signal 62, which is generated by the internal sync signal generator 60 at a predetermined timing following the receipt of the sync signal 40, the write amplifier 500 drives one of the data bus lines DB and /DB down to level L in accordance with a write data signal 115. One of the bit lines BL and /BL connected via the column transfer gate is also driven down to level L, and the latched state of the memory cell MC is inverted or maintained. It should be noted that, when a write enable signal 114 (WE) indicates the read status, the write amplifier 500 is not activated, regardless of whether the activation sync signal 62 has been received.

Figure 4:
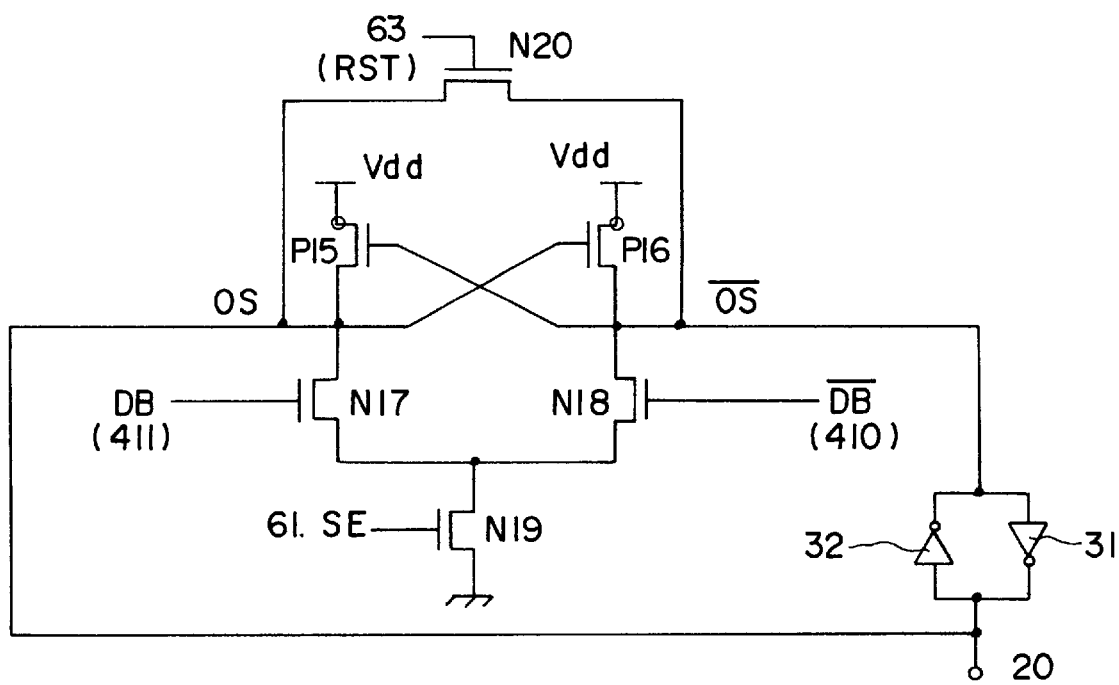
FIG. 4 is a circuit diagram illustrating one example of a sense amplifier.
Figure 5:
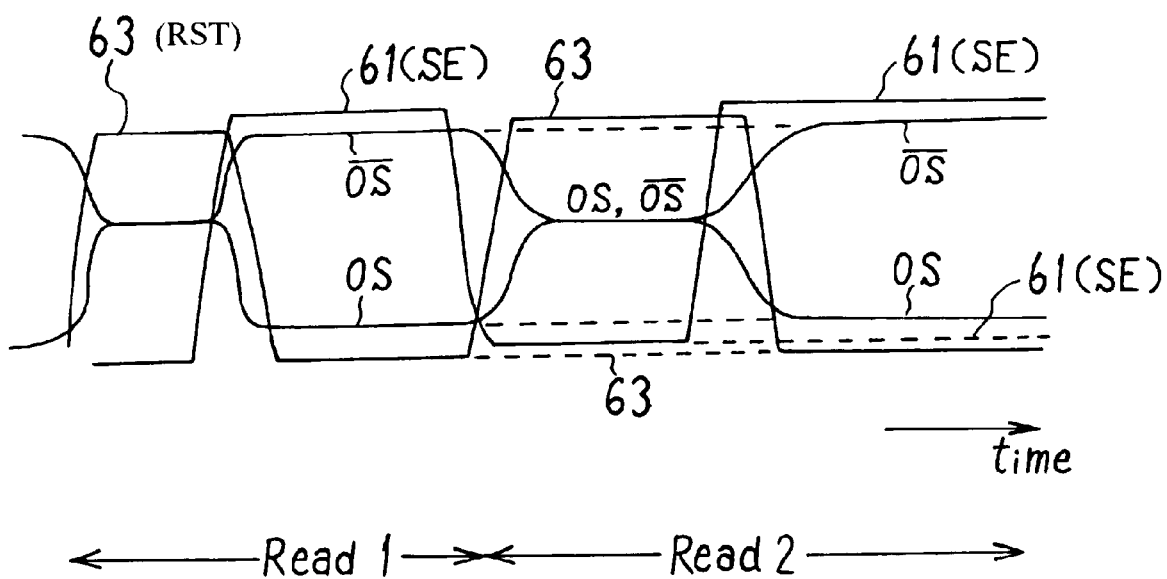
FIG. 5 is a signal waveform diagram showing a reading operation.

FIG. 4 is a circuit diagram illustrating one example of the sense amplifier and FIG. 5 is a signal waveform diagram showing the reading operation. The sense amplifier is a differential amplifier constituted by P type transistors P15 and P16 and N type transistors N17 and N18. The gates and drains of the P type transistors are so connected that the connection lines intersect each other, and a latch function is provided. The sense enable sync signal 61 (SE) is supplied to the gate of the N type transistor N19, and an N type transistor N20 for voltage equalization, which is located between output terminals OS and /OS of the differential amplifier, is rendered conductive upon the receipt of the reset sync signal 63. In addition, paired data bus liens 411 (DB) and 410 (/DB) are connected to the gates of the N type transistors N17 and N18, and a voltage difference between the data bus lines is detected. Further, provided is a latch circuit, which is constituted by inverters 32 and 31 for latching the outputs at the output terminals OS and /OS of the differential amplifier and to which the output terminal 20 is connected.

The reading operation is initiated when the write/read control signal WE is at level H. In the reading operation in this embodiment, as is shown in FIG. 5 for the reading operation, the equalization transistor N20 is rendered conductive in order to set the output terminals OS and /OS at the same level. Then, the transistor N20 is rendered non-conductive, while in response to the sense enable sync signal 61 (SE), the transistor N19 is rendered conductive. The differential amplifier is thus activated, detects the voltage difference between the data bus lines DB (411) and /DB (410), and latches detection signals OS, /OS in the latch circuit constituted by the inverters 32 and 31. Thereafter, even when the sense enable sync signal 61 goes to level L and the differential amplifier is deactivated, the detection signal is held by the latch circuit.

In the above described reading operation, the reset sync signal 63 (RST) at level H is supplied and then the sense enable sync signal 61 (SE) at level H is supplied. As is shown in FIG. 5, however, when there is no change in the address signals and the reading operation is performed for the same memory, first, the output terminals OS and /OS are driven to a middle level in response to the reset sync signal 63 (RST), and then they are respectively driven to the power voltage level $V_{dd}$ and the ground level in response to the sense enable sync signal 61 (SE). Therefore, the resetting operation and the activation of the differential amplifier in the second reading process are unnecessary.

Thus, in this embodiment, as is indicated by broken lines, when the externally supplied write/red control signal WE is maintained at level H and no address signals are transitted, the generation of the reset sync signal 63 (RST) and the sense enable sync signal 61 (SE) at level H is inhibited. As a result, the resetting operation and the activation of the differential amplifier can be eliminated from the second reading process Read2.

Figure 6:
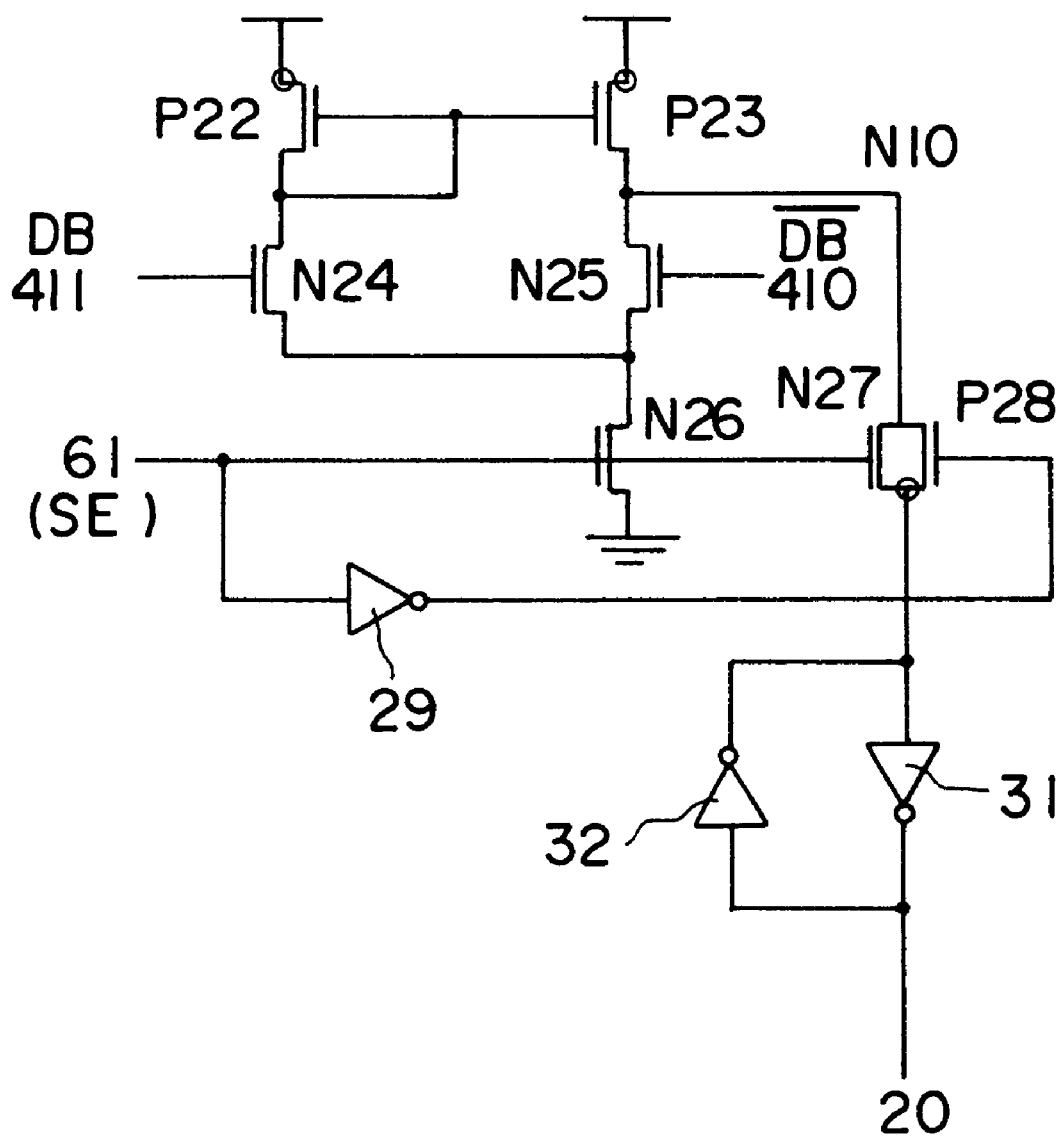
FIG. 6 is a circuit diagram illustrating another example of the sense amplifier.
Figure 7:
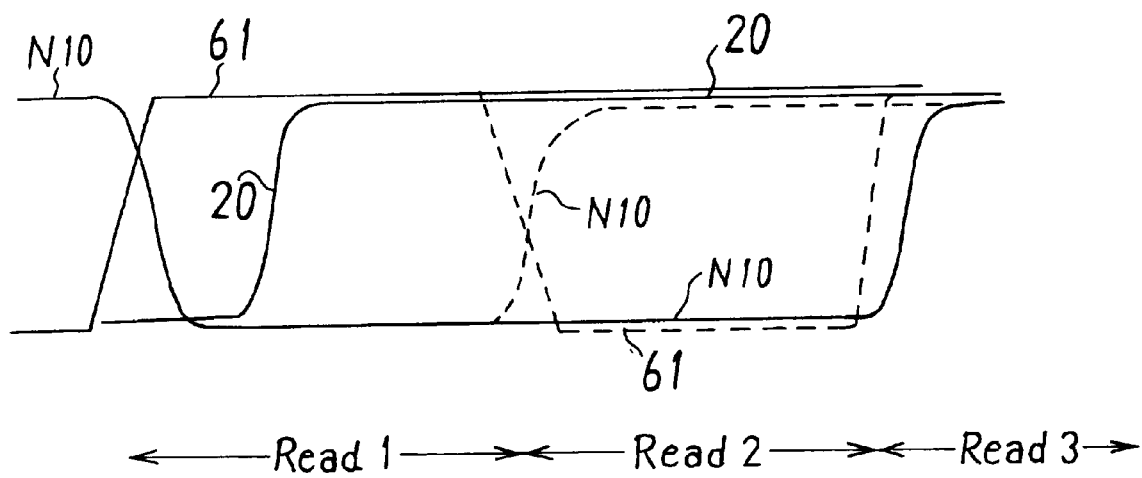
FIG. 7 is a signal waveform diagram showing a reading operation.

FIG. 6 is a circuit diagram illustrating another example of the sense amplifier, and FIG. 7 is a signal waveform diagram showing the reading operation performed by the sense amplifier. The sense amplifier includes P type transistors P22 and P23 and N type transistors N24 and N25. The P type transistors P22 and P23 constitute a load circuit connected in a mirrored current manner. Paired data bus lines 410 (/DB) and 411 (DB) are connected to the N type transistors N24 and N25, and a difference in voltages on the data bus lines is detected. Also, a sense enable sync signal 61 (SE) is transmitted to the transistor N26. The sense amplifier serves as a differential amplifier, and a latch function is accomplished by a latch circuit constituted by inverters 32 and 31. When a transfer switch constituted by transistors N27 and P28 is rendered conductive by the sense enable sync signal 61 (SE), the data read are detected by the differential amplifier at node N10 and held by the latch circuit 32, 31.

In the reading operation performed by the sense amplifier, as is shown in FIG. 7, the node N10 is set at level H by the P type transistor P23. When upon the receipt of the external sync signal 40 the sense enable sync signal 61 (SE) is driven up to level H by the internal sync generator 60 at a predetermined timing, the transistor N26 is rendered conductive and activates the sense amplifier. When the sense amplifier detects the level H of the data bus line 410 (/DB) or the level L of the data bus line 411 (DB) and the node N10 goes to level L, the level L of the node N10 is latched by the latch circuit, which includes the inverters 32 and 31, and the output terminal 20 goes to level H.

In this condition, a through current consistently flows from the power source $V_{dd}$ to the ground via the transistors P23, N25 and N26 in the differential amplifier, which includes the transistors P22, P23 and N24 to N26. Conventionally, even when no transition occurs in the next cycle in the address signals $A_0$ to $A_3$ and the write/read control signal WE, the sense enable sync signal 61 (SE) is driven up to level H in response to the next supplied sync signal 40. As a result, the differential amplifier again supplies the above through current. However, the read data are held by the latch circuit constituted by the inverters 32 and 31, and no transition occurs in the address signals at the next cycle. Therefore, the same reading data will be detected and the same data will be latched.

In this embodiment of the present invention, as is indicated by the broken lines in FIG. 7, the internal sync signal generator 60 detects, from the level of the read transition detection signal 51, the condition at which there is no transition in the address signals $A_0$ to $A_3$ and the write/read control signal WE, and does not drive the sense enable internal sync signal 61 (SE) up to level H, regardless of whether the external sync signal 40 is received. As a result, the transistor N26 of the differential amplifier is rendered non-conductive, and the wasteful flowing of the through current is prevented. Since the transfer gates N27 and P28 are non-conductive even though the node N10 goes to level H, the state of the latch circuit can be maintained.

Figure 8:
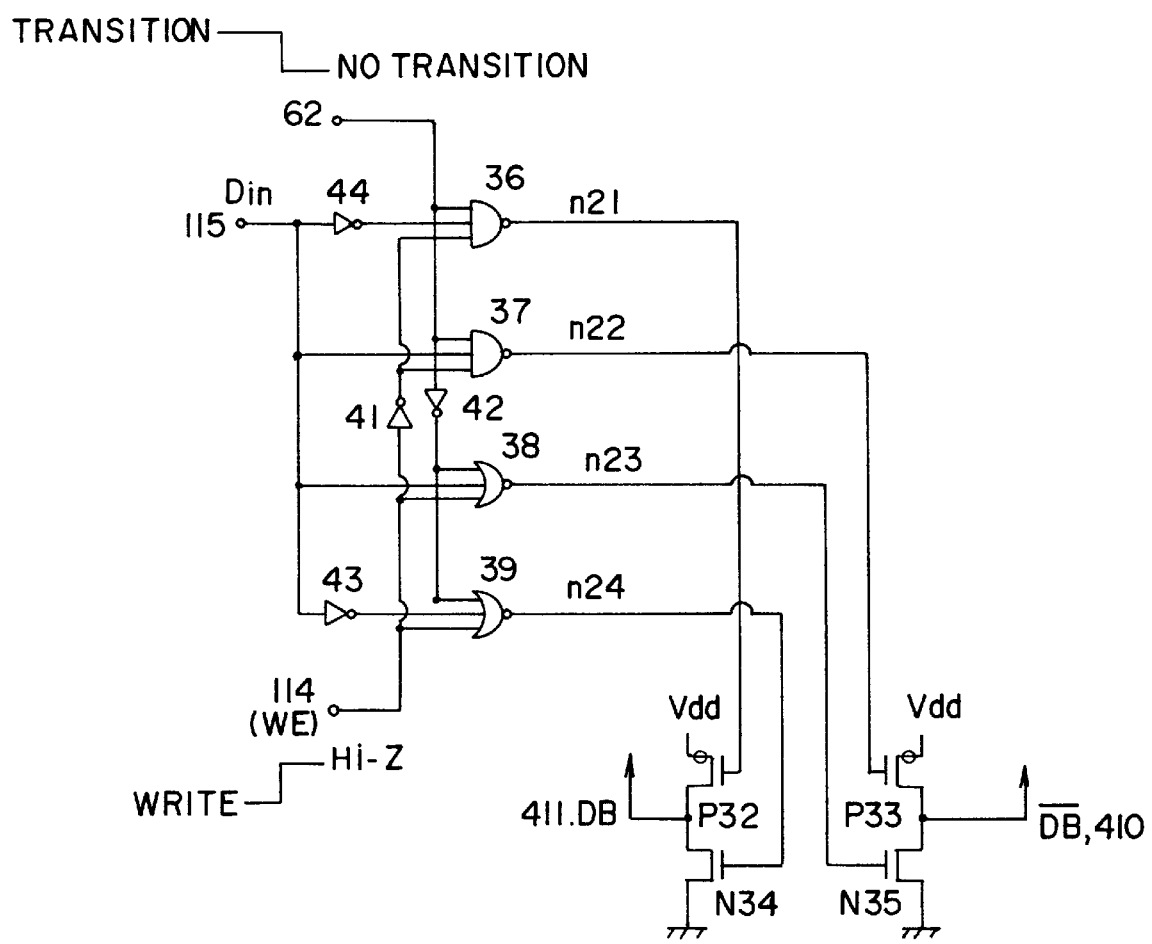
FIG. 8 is a circuit diagram illustrating a write amplifier.
Figure 9:
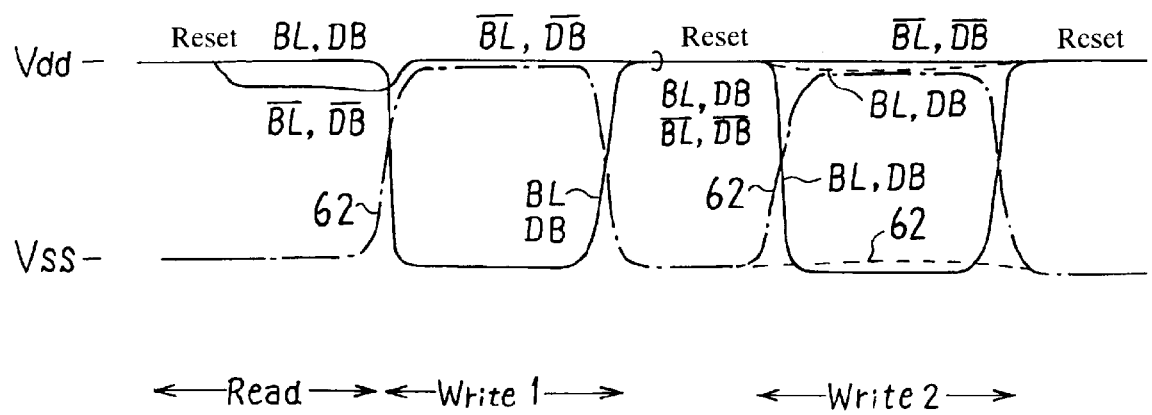
FIG. 9 is a signal waveform diagram showing a writing operation.

FIG. 8 is a circuit diagram illustrating the write amplifier, and FIG. 9 is a signal waveform diagram for the writing operation. Write data $D_{in}$, a write/read control signal 114 (WE) and an activation sync signal 62, generated by the internal sync signal generator 60, are supplied to the write amplifier in FIG. 8. The write amplifier includes the P type transistors P32 and P33 and the N type transistors N34 and N35. The transistors P32 and N34 constitute a CMOS inverter for driving the data bus line 411 (DB). The transistors P33 and N35 constitute a CMOS inverter for driving the data bus line 410 (/DB). A drive signal is supplied to the gates of these transistors from NAND gates 36 and 37 and NOR gates 38 and 39.

Assuming that the write enable signal 114 (WE) is at level L for data writing and the write data 115 ($D_{in}$) is at level H, when a transition occurs in either the address signals $A_0$ to $A_3$, the write enable signal WE or the write data $D_{in}$, in accordance with the first level of the write transition detection signal 52, the internal signal generator 60 drives the activation sync signal 62 up to level H at a predetermined timing.

As a result, a node n21 goes to level H, a node n22 goes to level L, a node n23 goes to level L and a node n24 goes to level H. Therefore, the transistors N34 and P33 are rendered conductive and drive the data bus line 411 (DB) down to level L and the data bus line 410 (/DB) up to level H.

When the write data $D_{in}$ is at level L, the node n21 goes to level L, the node n22 goes to level H, the node n23 goes to level H, and the node n24 goes to level L. Therefore, the transistors N35 and P32 are rendered conductive, and drive the data bus line 411 (DB) to level H and the data bus line 410 (/DB) to level L.

When the write enable signal 114 (WE) is at level H, the nodes n21 and n22 go to level H, while the nodes n23 and n24 go to level L, and the nodes 410, 411 are set to the H impedance state.

As is shown in the waveform diagram in FIG. 9, during the writing operation one of the data bus lines and one of the bit lines are driven to level L by the write amplifier. When the writing operation has been completed, the data bus line and the bit line are driven up by the reset circuit 700 up to the power voltage level $V_{dd}$, which is the reset level.

Therefore, for a case where the writing is to be repeated for the same write data at the same address, conventionally, as is indicated by the chained line in FIG. 9, although the writing to the memory cell is completed, the activation sync signal 62 is driven up to level H, one bit line and one data bus line are driven down by the write amplifier to level L, and driven up to the reset level again. The driving the bit line and data line to the reset level wastes current.

In the embodiment of the present invention, when no transition is detected for the address signals, the write data $D_{in}$ and the write enable signal WE, in accordance with the second level of the write shift detection signal 52, the internal sync generator 60 maintains the activation sync signal 62 at level L, as shown as a broken line in FIG. 9, regardless of whether the external sync signal 40 is received. As a result, at the next cycle, the write amplifier does not drive the data bus lines, and accordingly, unnecessary driving of the data bus lines and the bit lines is not performed. Therefore, the driving of the data bus line and the bit line to the reset level is not performed, and the associated consumption of power can be prevented.

Figure 10:
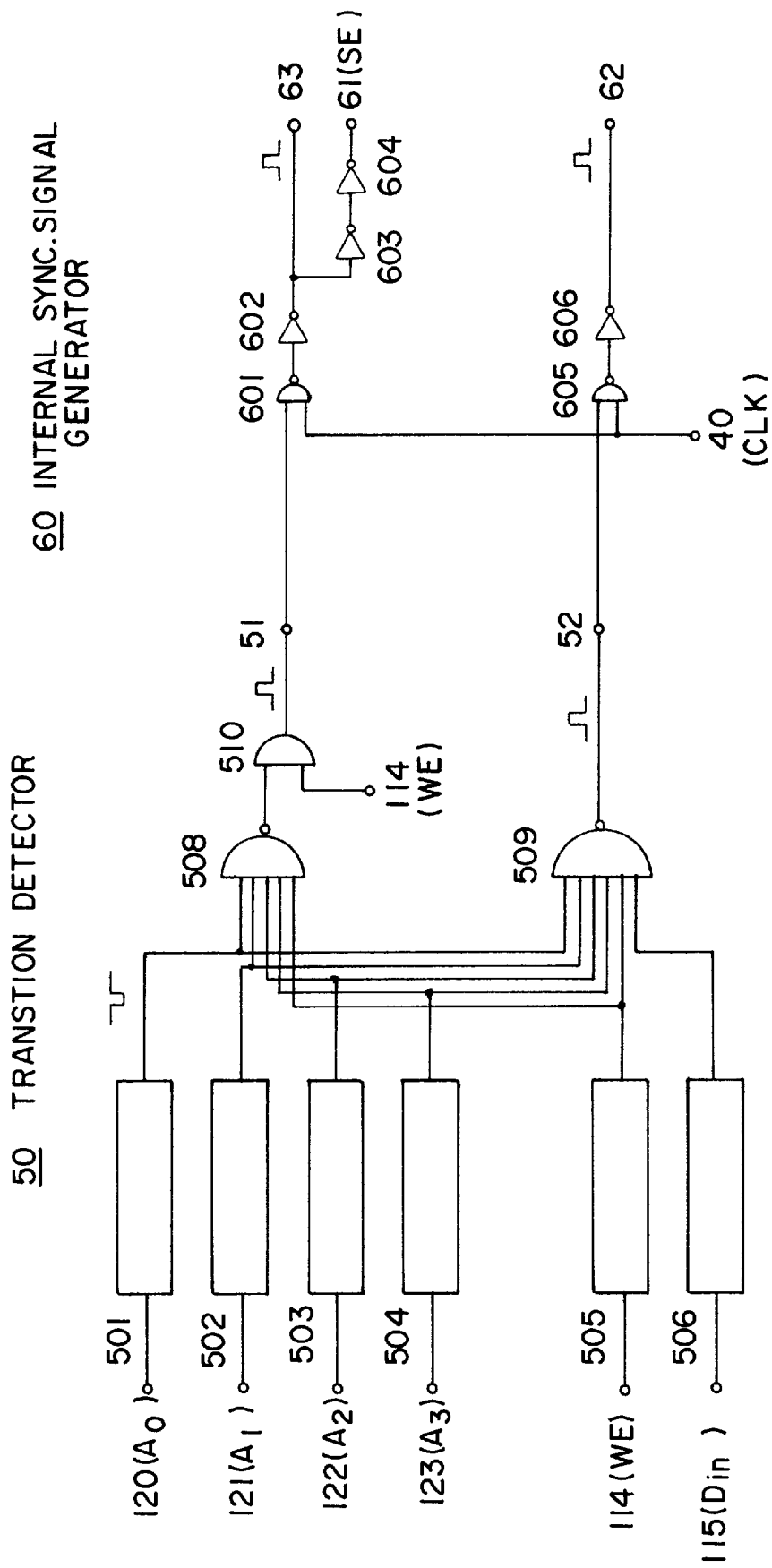
FIG. 10 is a circuit diagram illustrating a transition detector and an internal sync signal generator.

FIG. 10 is a circuit diagram illustrating the transition detector and the internal sync signal generator. The transition detector 50 comprises transition detectors 501~506 each of which detects the transition of the output terminals 120 to 123, each of which is an output terminal corresponding to one of the input registers 100 to 103 for the address signals $A_0$ to $A_3$, the output terminal 114 of the input register 104 for the write/read control signal 114 (WE), and the transition detection circuits 506 for detecting the transitions in the output 115 of the input register 105 for the input data $D_{in}$; NAND gates 508 and 509; and an AND gate 510.

Each transition detection circuit 501~506 detects the transition of the individual input signal, and outputs a pulse at level L at each output. The NAND gate 508 receives the outputs from the transition detection circuit 501 to 505, and generates a read transition detection signal 51. It should be noted, however, that when the control signal 114 (WE) is level L, indicating the writing state, the AND gate 510 receiving the write/read control signal 114 (WE) inhibits the output of the NAND gate 508 from passing as the read shift detection signal 51.

Therefore, when the write/read control signal 114 (WE) is at level H, indicating the reading state, and when the transition occurs either in the address signals 120 to 123 or the write/read control signal 114 (WE), the read transition detection signal 51 is generated as a pulse with level H.

The NAND gate 509, which receives the results from the transition detection circuits 501 to 506, generates the write transition control signal 52 as a pulse with level H when the transition occurs in the address signals 120 to 123, the write/read control signal 114 (WE), or the write data 115 ($D_{in}$).

The internal sync signal generator 60 includes NAND gates 601 and 605, and inverters 602 to 604 and 606. In response to an external sync signal 40 (CLK) at level H, the pulse signal included in the read transition signal 51 is employed to generate the sense enable sync signal 61 (SE) and the reset sync signal 63. The sense enable sync signal 61 (SE) is changed by the inverters 603 and 604 to a pulse at level H which is delayed compared with the reset sync signal 63. In addition, in response to the external sync signal 40 (CLK) at level H, the activation sync signal 62 is generated from the pulse signal included in the write transition detection signal 52.

Figure 11:
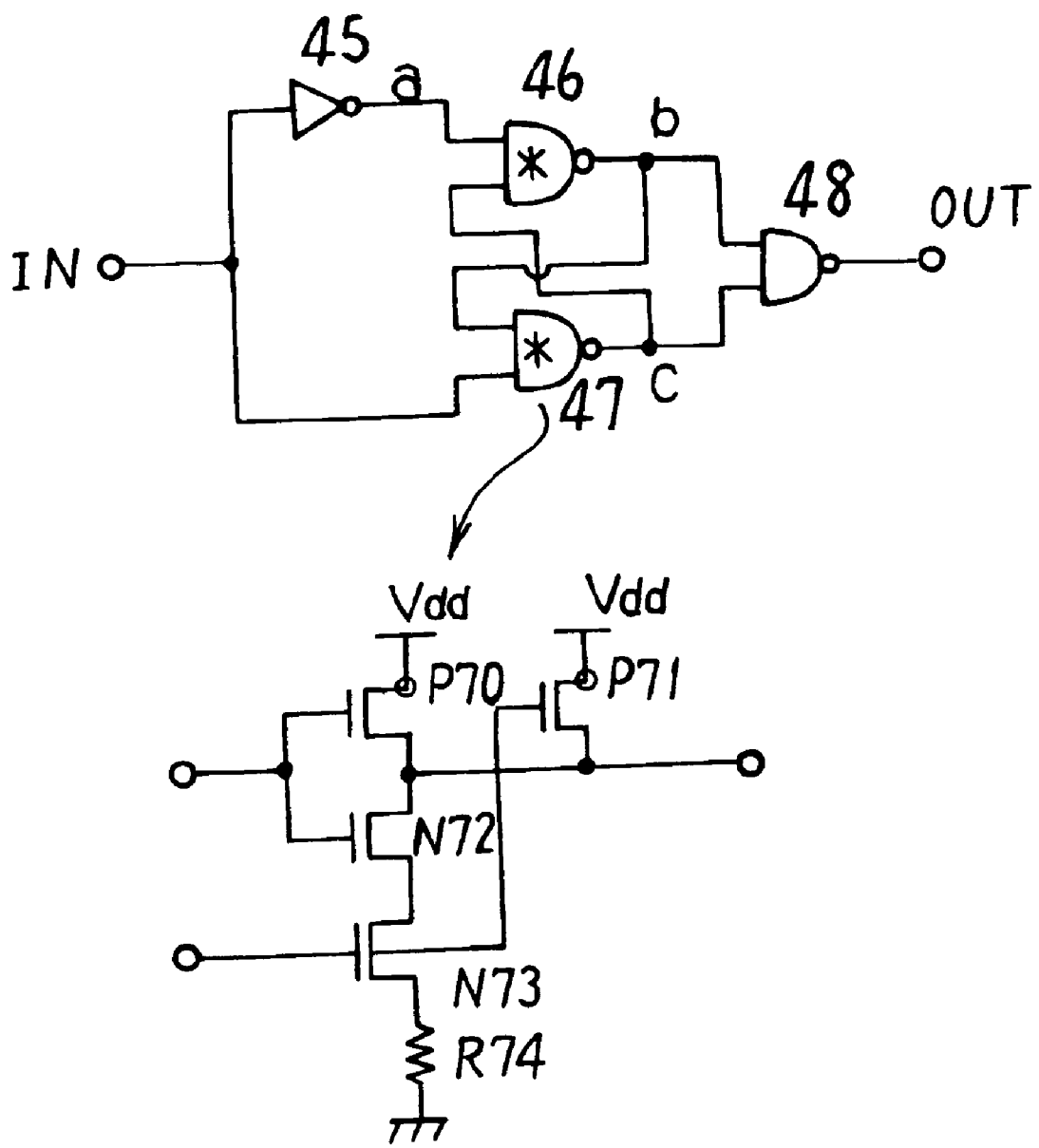
FIG. 11 is a detailed circuit diagram illustrating the transition detector.

FIG. 11 is a diagram illustrating the transition detection circuit. In this circuit, input data IN is supplied via an inverter 45 to one of the input terminals of a NAND gate 46, and to one of the input terminals of a NAND gate 47. The NAND gates 46 and 47 each receive the output of the other gate at their remaining input terminals, and the outputs b and c are supplied to a NAND gate 48. As is shown in FIG. 11, the NAND gates 46 and 47 are constituted by P type transistors P70 and P71, N type transistors N72 and N73, and a resistor R74. Because of the inclusion of the resistor R74, the output of each of the NAND gates is gradually falling down to level L.

Figure 12:
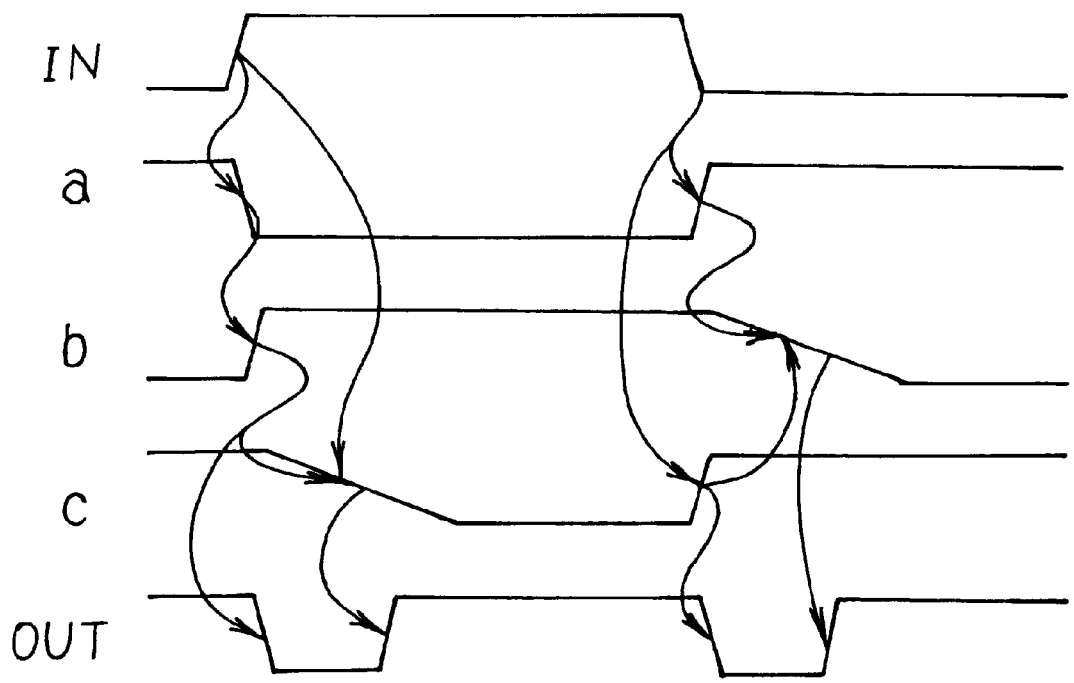
FIG. 12 is an operation waveform diagram for the transition detector in FIG. 11.

FIG. 12 is an operational waveform diagram illustrating the transition detector in FIG. 11. As is shown in FIG. 12, when the input IN rises, the output c of the NAND 47 slowly falls while the node b rises. Therefore, a pulse at level L is generated at the output terminal OUT. When the input IN falls, the output b of the NAND 46 slowly falls as the node c rises, and a pulse at level L is generated at the output terminal OUT.

As is described above, the transition detection circuit detects the transition in the input IN and generates a pulse at level L.

Figure 13:
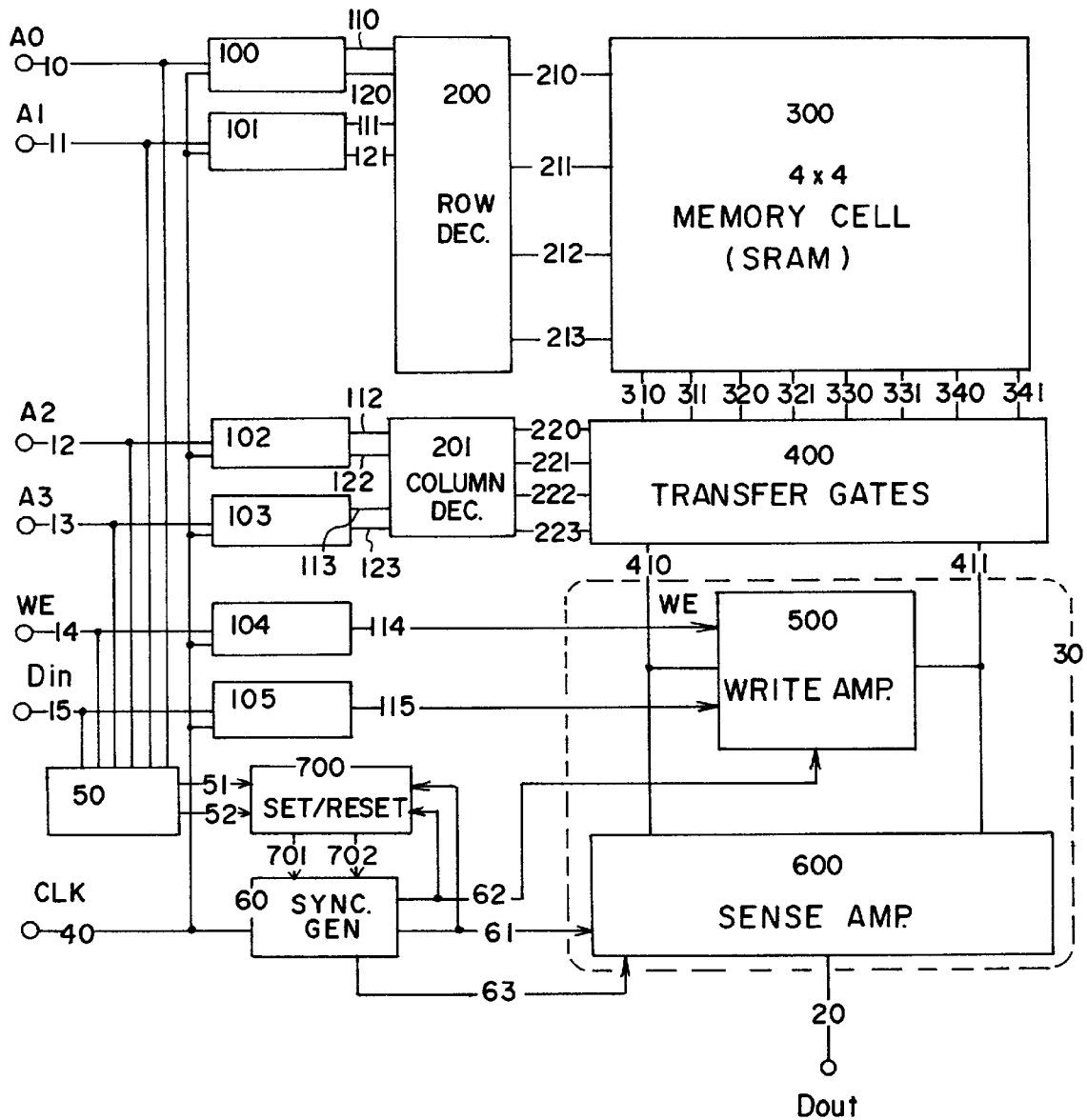
FIG. 13 is a diagram illustrating the arrangement of a semiconductor storage device according to a second embodiment of the present invention.

FIG. 13 is a diagram illustrating the arrangement of a semiconductor storage device according to a second embodiment of the present invention. In this embodiment, a transition detector 50 does not monitor the outputs of input registers for latching their input signals, but monitors and detects a transition in an externally supplied signal directly. Therefore, since the input signals are transitted asynchronously with the external clock 40, output signals 51 and 52 of the transition detector 50 are latched by a set/reset circuit 700. Output signals 701 and 702 of the set/reset circuit 700 are supplied to an internal sync signal generator 60, which, as well as in the first embodiment, generates a sense enable sync signal 61 (SE), a rest sync signal 63 (RST) and an activation sync signal 62. The rest of the arrangement is the same as that in FIG. 2.

Figure 14:
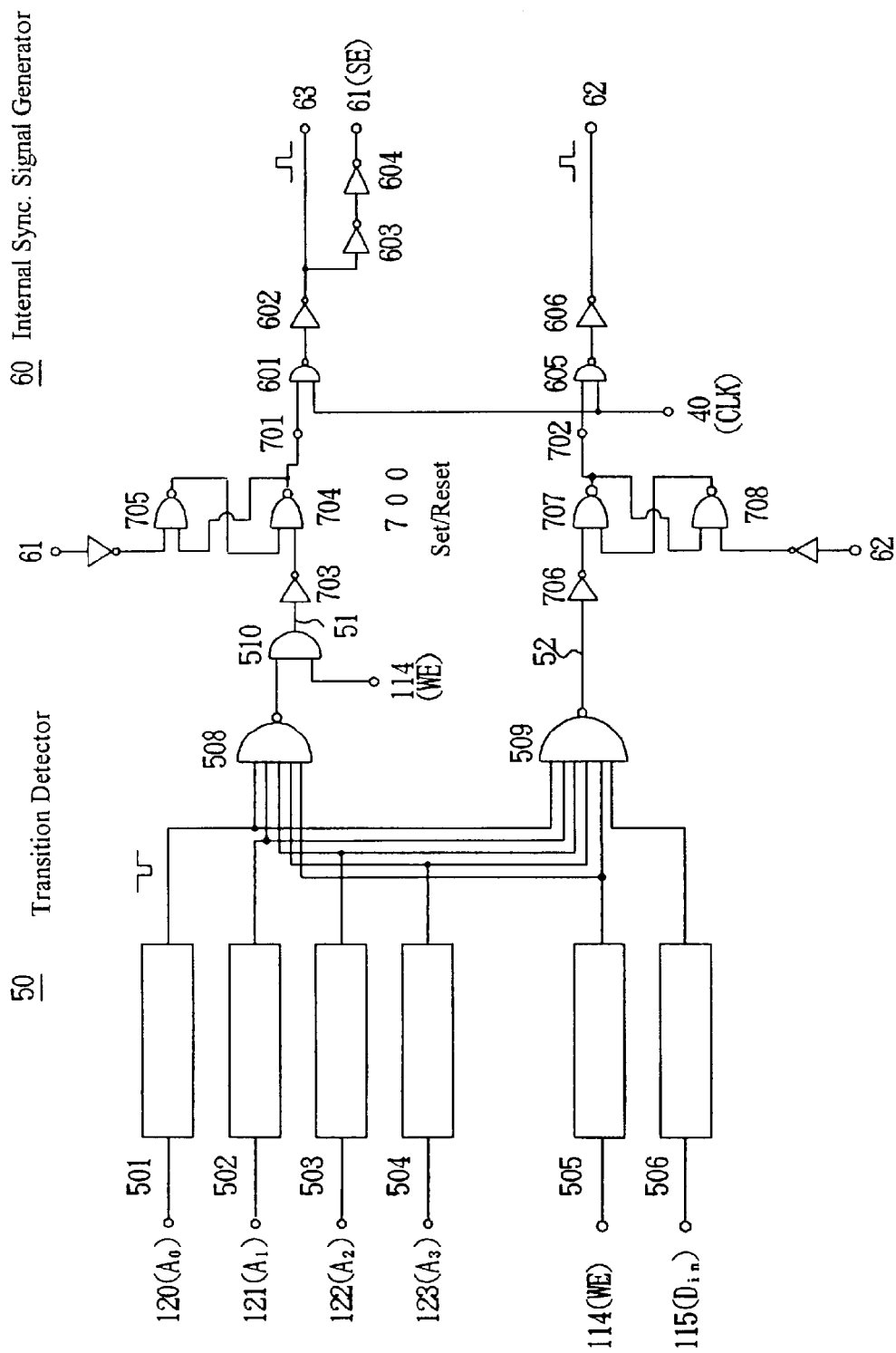
FIG. 14 is a diagram illustrating the transition detector, the set reset circuit, and the internal sync signal generator shown in FIG. 13.

FIG. 14 is a diagram illustrating the transition detector 50, the set/reset circuit 700 and the internal sync signal generator 60 shown in FIG. 13. In FIG. 14, the set/reset circuit 700 is inserted between the transition detector 50 and the internal sync signal generator 60 shown in FIG. 10. The set/resent circuit 700 includes NAND gates 704 and 705 for latching a read transition detection signal 51, and NAND gates 707 and 708 for latching a write transition detection signal 52. These latch circuits latch the read transition detection signal 51 and the write transition detection signal 52, and transmit the latch signals 701 and 702 to the internal sync signal generator 60. The latch circuits are reset by the internal sync signals 61 and 62.

In the second embodiment, since the transition in the externally supplied signal can be directly detected, the occurrence of the transition can be detected more quickly than in the first embodiment, and the internal sync signals 61, 62, 63 can be generated which has a predetermined timing synchronized with the external clock 40 (CLK). As well as in the first embodiment, an unnecessary operation performed by the sense amplifier, which is accompanied by the repetitious reading of data at a previous read address, can be eliminated, as can an unnecessary operation performed by the write amplifier, which is accompanied by the repetitious writing of data at a previous write address.

The above embodiments can be applied for a SRAM embedded in a system LSI. In this case, a signal is supplied by a system in the same LSI.

As is described above, according to the present invention, the occurrence of a transition in either the address signals, the write/read control signal, or the write data can be detected, and when the same reading process is to be repeated, the operation of the sense amplifier can be inhibited, while when the same writing process is to be repeated, the operation of the write amplifier can be inhibited. Therefore, the wasteful consumption of power for unnecessary operations by the sense amplifier and the write amplifier can be avoided.

What is claimed is:

1. A synchronization circuit, which receives a plurality of input signals and an external sync signal and performs a predetermined operation corresponding to said input signals in synchronization with said external sync signal, comprising:

a transition detector for detecting each transition of said plurality of input signals and for generating a transition detection signal indicating that said transition occurs; and an internal sync signal generator for, upon the receipt of said external sync signal, supplying an internal sync signal to said synchronization circuit when said transition detection signal indicates that said transition occurs, and for ceasing to supply said internal sync signal to said synchronization circuit, regardless of whether said external sync signal is received, when said transition detection signal does not indicate that said transition occurs.

2. A synchronization circuit according to claim 1, wherein said synchronization circuit waits for said external sync signal during a reset condition and performs said predetermined operation in response to said internal sync signal.

3. A semiconductor storage device, which has a plurality of memory cells and which at least receives a plurality of address signals, a read control signal, and an external sync signal, comprising:

a sense amplifier for detecting data in said memory cell;

a transition detector for detecting each transitions of said plurality of address signals and said read control signal, and for generating a transition detection signal indicating that one of said transitions occurs; and an internal sync signal generator for, upon the receipt of said external sync signal, supplying a read sync signal to said sense amplifier when said transition detection signal indicates said occurrence of said transition, and for ceasing to supply said read sync signal to said sense amplifier, regardless of whether said external sync signal is received, when said transition detection signal does not indicate said transition occurs, wherein said sense amplifier is operated upon the receipt of said read sync signal.

4. A semiconductor storage device according to claim 3, wherein said sense amplifier includes a differential amplifier for differentially detecting data from said memory cell and for latching a complementary signal, and a reset section for short-circuiting said complementary signal before a detection operation; and in response to said read sync signal, said reset section is short-circuited.

5. A semiconductor storage device according to claim 3, wherein said sense amplifier includes a detection section for detecting data from said memory cell, and a latch section for latching a detected signal; and in response to said read sync signal, said detection section performs a detection operation.

6. A semiconductor storage device according to one of claims 3 to 5, wherein said transition detector receives signals output by input circuits which receive said plurality of address signals and said read control signal, and detects a transition in said signals output by said input circuits.

7. A semiconductor storage device according to one of claims 3 to 5, wherein said transition detector directly detects each transition in said plurality of address signals and in said read control signal which are received, and latches said read sync signal.

8. A semiconductor storage device according to claim 3, wherein said semiconductor storage device waits for said external sync signal during a reset condition.

9. A semiconductor storage device, which has a plurality of memory cells and which at least receives a plurality of address signals, a write control signal, a write data signal and an external sync signal, comprising:

a write amplifier for, upon the receipt of said data write signal, driving a bus line pair connected to said memory cell;

a transition detector for detecting each transition of said plurality of address signals, said write data signal and said write control signal and for generating a transition detection signal indicating that one of said transitions occurs; and an internal sync signal generator for, upon the receipt of said external sync signal, supplying an internal sync signal to said write amplifier when said transition detection signal indicates that said transition occurs, and for ceasing to supply said internal sync signal to said write amplifier, regardless of whether said external sync signal is received, when said transition detection signal does not indicate that said transition occurs, wherein said write amplifier drives said bus line pair when said internal sync signal is received, and does not drive said bus line pair when said internal sync signal is not received.

10. A semiconductor storage device according to claim 9, wherein said transition detector receives signals output by input circuits which receive said plurality of address signals, said write data signal and said write control signal, and detects the transition in said signals output by said input circuits.

11. A semiconductor storage device according to claim 9, wherein said transition detector directly detects each transition in said plurality of address signals, in said write data signal and in said write control signal which are received, and latches said internal sync signal.

12. A semiconductor storage device according to claim 9, wherein said semiconductor storage device waits for said external sync signal during a reset condition.

* * * * *